United States Patent [19]

Martino

[11] 4,119,991
[45] Oct. 10, 1978

[54] HORIZONTAL ONE STEP AUTOMATIC PLATE PROCESSOR

[76] Inventor: Peter Vincent Martino, 99-60 65th Rd., Rego Park, N.Y. 11374

[21] Appl. No.: 785,985

[22] Filed: Apr. 8, 1977

[51] Int. Cl.² .............................................. G03D 3/08
[52] U.S. Cl. ..................................... 354/320; 354/338
[58] Field of Search ............... 354/317, 318, 319, 320, 354/322, 338

[56] References Cited

U.S. PATENT DOCUMENTS

| | | | |
|---|---|---|---|
| 3,589,261 | 6/1971 | Krikelis | 354/322 |
| 3,593,641 | 7/1971 | Adams | 354/317 |
| 3,608,464 | 9/1971 | Harrell | 354/317 |
| 3,682,079 | 8/1972 | Casson | 354/318 |
| 3,903,541 | 9/1975 | Meister et al. | 354/317 |
| 3,916,426 | 10/1975 | Bown | 354/319 |

Primary Examiner—L. T. Hix
Assistant Examiner—Alan Mathews

Attorney, Agent, or Firm—Anthony J. Casella; Joseph A. Calvaruso

[57] ABSTRACT

A compact, simple, fully automatic table-top plate processor for developing offset plates which are inserted horizontally in the front and ejected horizontally from the rear using paired transport rollers and brush rollers training the plate at the exit and thus provides a finished press-ready or storable plate in one cycle. Top rollers fit into essentially vertical slots and have keyed bearings to prevent rotation. The roller drive motor is of such a speed as to provide the proper dwell time prior to the plate being brushed on both sides. The processor provides automatic developing of the plate in an essentially horizontal feed-through operation permitting use on the top of an existing table surface and requiring a minimum of space. By combining the gum into the developer solution the need for several stages (develop, rinse, condition, gum, etc.) is eliminated and this one step machine provides a unique compactness of design.

6 Claims, 5 Drawing Figures

HORIZONTAL ONE STEP AUTOMATIC PLATE PROCESSOR

SUMMARY OF THE INVENTION

It is the object of the present invention to provide processing of offset printing plates automatically while using a minimum of table top space. It is another object to provide automatic transport, dwell time, brushing, and squeegeing for plates inserted into the front of the apparatus. It is a further object to provide an apparatus which allows the usage of a combination developer/gum solution, which is stored in the machine, to act on a plate delivering said plate ready for press use, immediately or for storage for later use, without further handling or treatment. These and other objects are achieved by the present invention which provides a processor for developing printing offset plates in a shallow tank into which the plate is dipped and out of which the plate emerges completely processed, taking advantage of the ease with which a printing plate can be flexed. The processor includes a pair of transport rollers to train the plate downwards into the machine, a guidance mechanism which provides training of the plate, even if curled upwards or downwards, into the next pair of holding and orientation rollers which also redirect the plate onto a horizontal path, deflector which trains the lead edge of the plate onto a rising path, a pair of rotating brushes with a speed many times greater than the transport rollers which then scour both sides of the plate, a plate stiffening assembly consisting of essentially two closely spaced parallel platens which prevent the brushes from accelerating travel of the plate and consequent buckling especially at the tail end when said tail leaves the control of the prior holding and orientation rollers, and a final pair of squeege rollers which doctor off excess gum and retrain the plate into a horizontal path. A shaft with segmented rollers rotating at the same surface speed as plate travel insure complete ejection of said plate after it leaves the machine and is deposited on the receiving table.

DESCRIPTION OF THE PREFERRED EMBODIMENT

Figure 1:
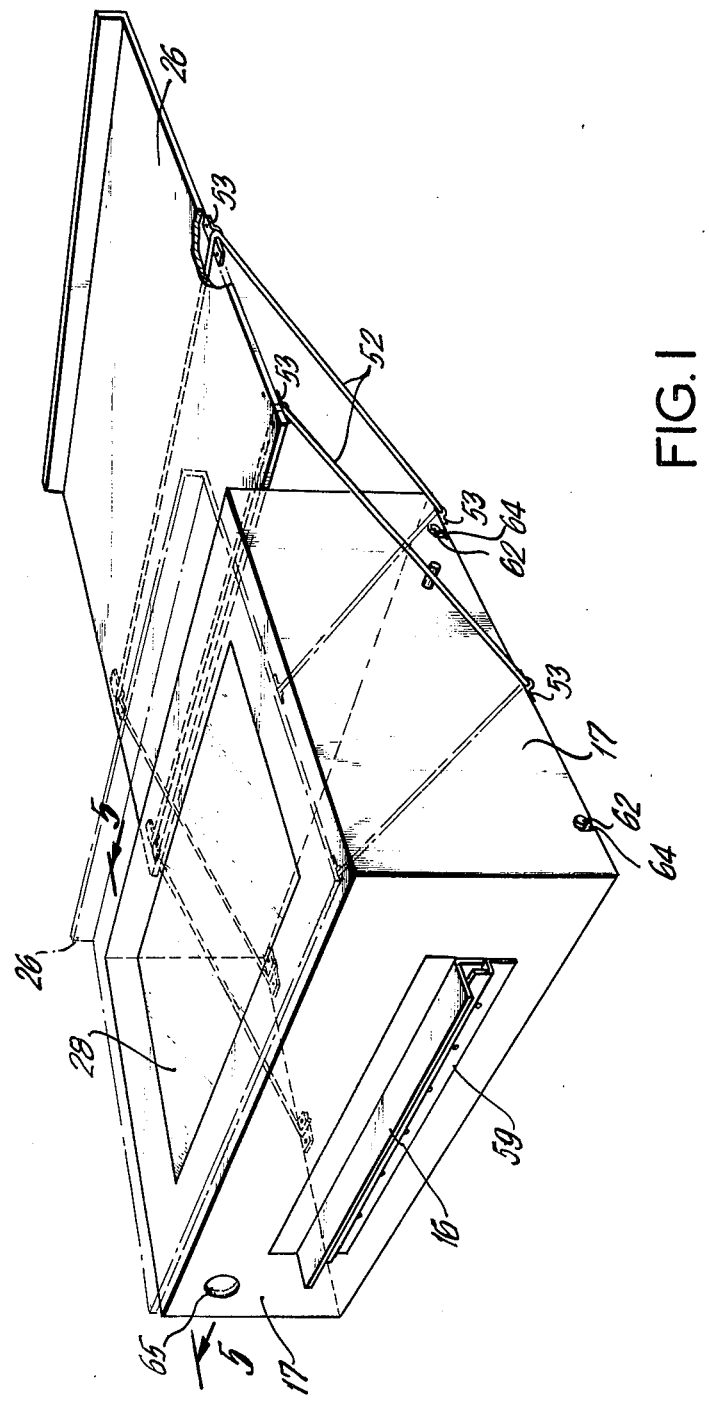
FIG. 1 is a perspective view of the outer casing of the apparatus of the subject invention.
Figure 2:
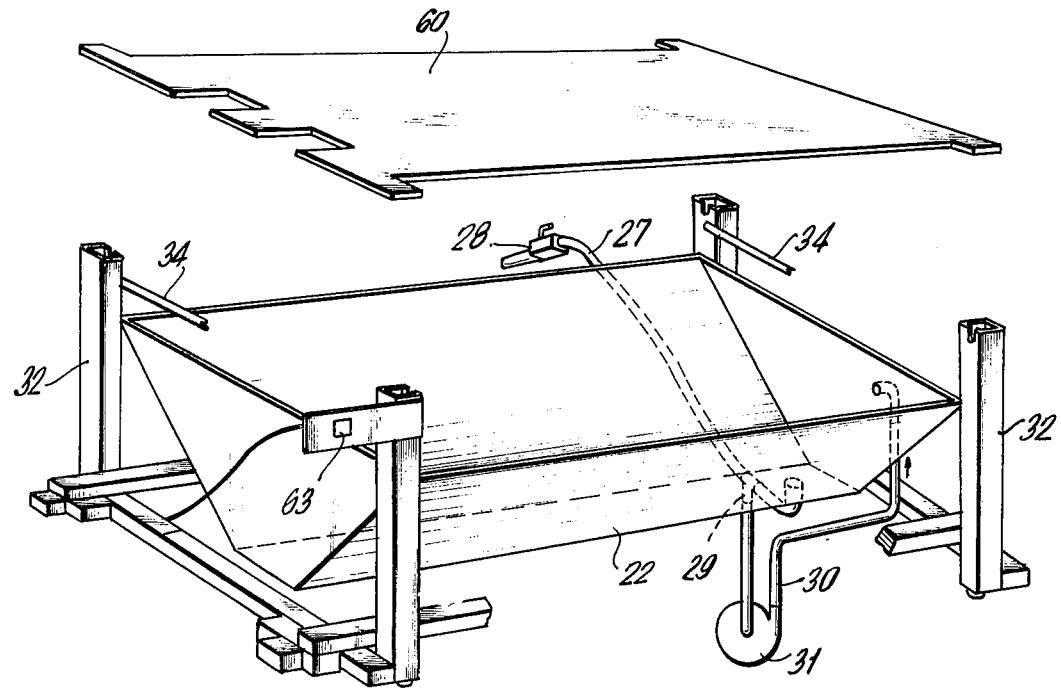
FIG. 2 is a perspective view of the supporting frame and tank of the apparatus of the subject invention.
Figure 3:
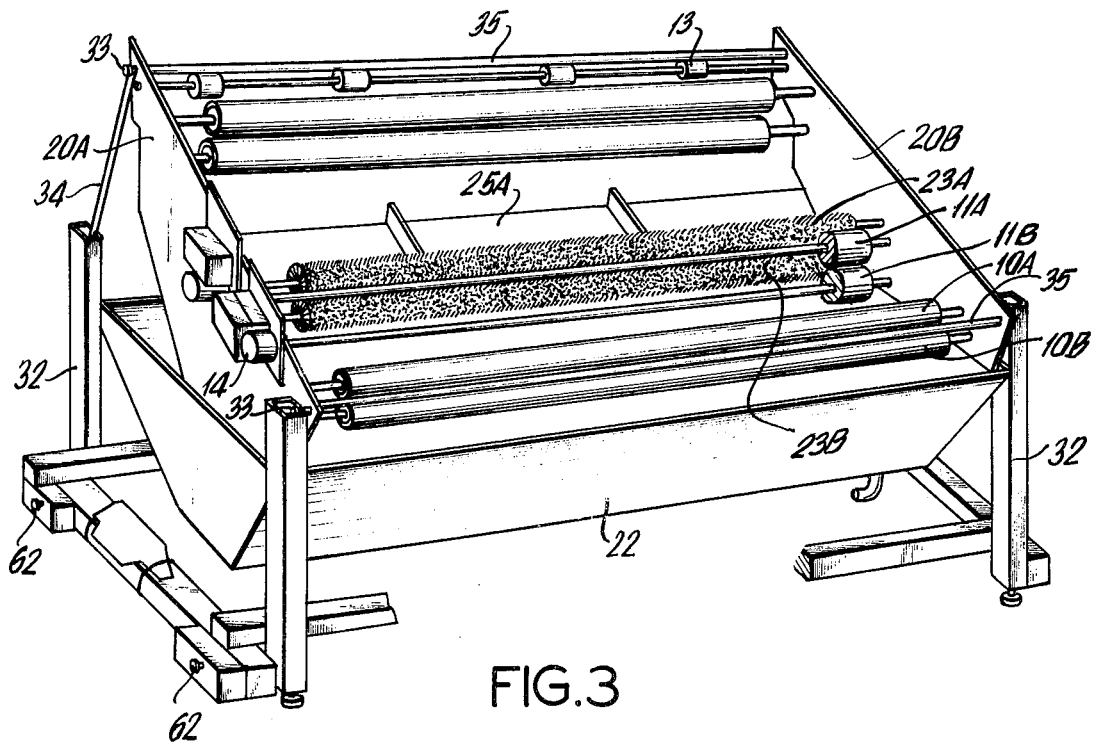
FIG. 3 is a perspective view, sectioned in part, of the apparatus of the subject invention illustrating the subject apparatus in the raised position.
Figure 4:
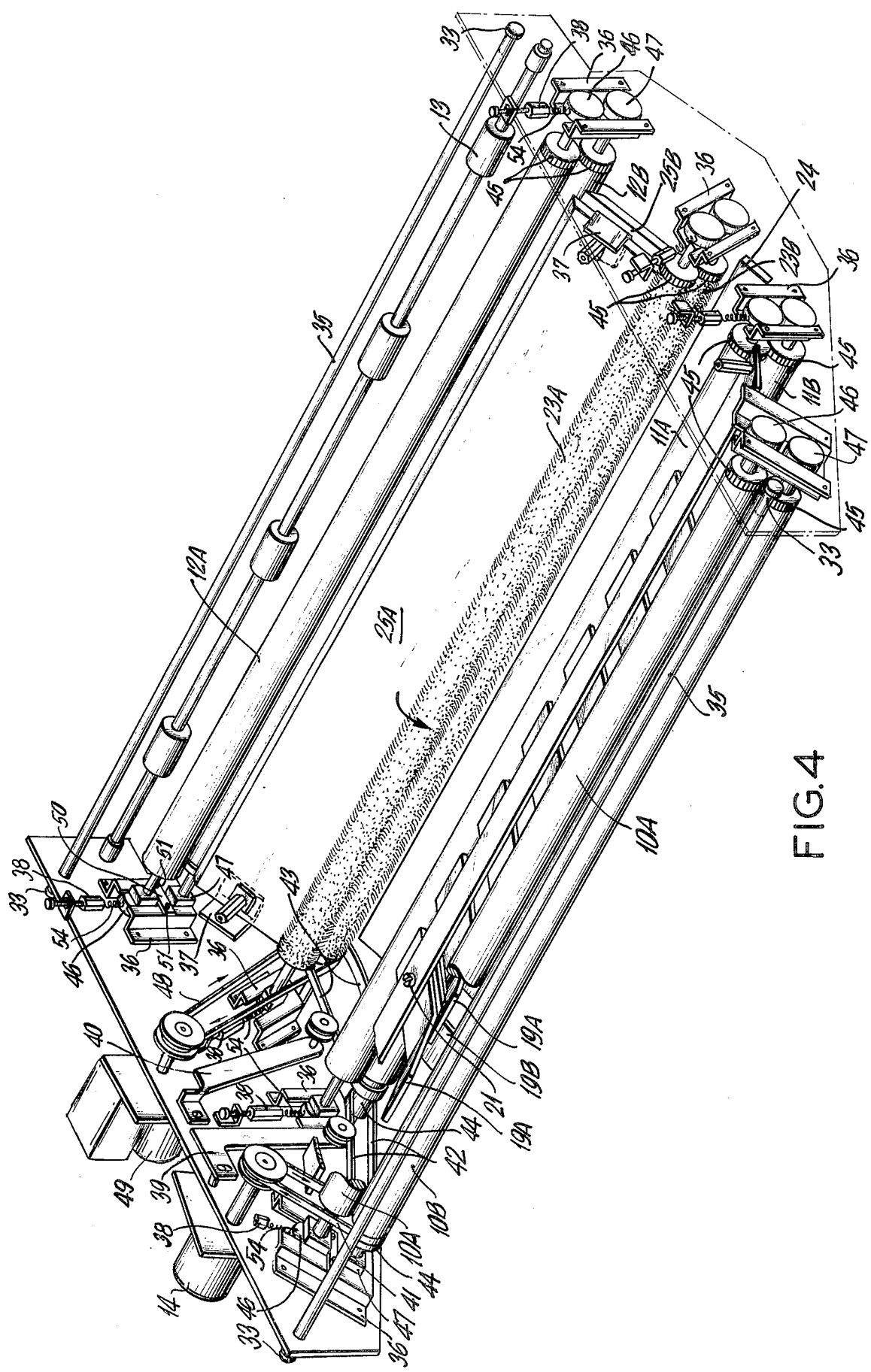
FIG. 4 is a partial perspective view illustrating the internal structure of the apparatus of the subject invention.
Figure 5:
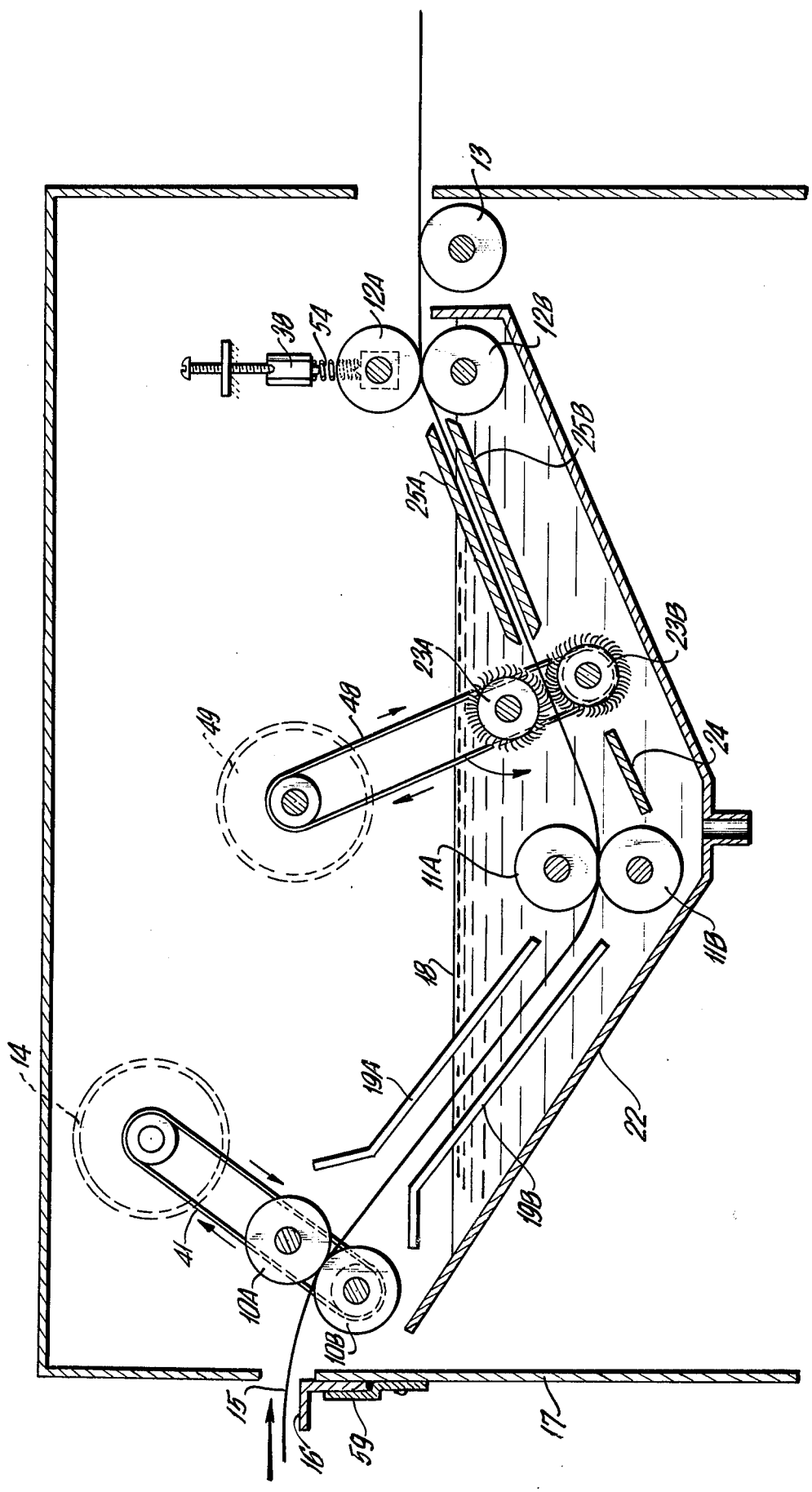
FIG. 5 is a diagrammatic sectional view of the apparatus of the subject invention.

Referring to FIGS. 3, 4 and 5 the apparatus consists of three sets of motorized transport rollers 10A, 10B, 11A, 11B, 12A, 12B and a lower ejector shaft 13 all powered by roller drive motor 14, so that a plate 15 (see FIG. 5) is trained by their orientation and equal surface speeds into and then out of the solution 18. The shafts are connected thru timing belts and sprocketed gears with means to adjust tension on all belts. Referring to FIG. 5, to start operation the motor switch is energized and the plate is positioned on the front table 16 which is attached to the casework 17 and pushed gently until the transport rollers 10A, 10B grab the leading edge. The transport rollers 10A, 10B are positioned above the level of the solution 18 thus staying dry and clean and providing maximum traction and control. The plate then enters the guidance mechanism 19A, 19B consisting of upper 19A and lower 19B parallel spaced segmented strips with flared leading edges. The top set 19A (see FIG. 4) is permanently mounted to the mechanism side plates 20A, 20B and the lower set 19B is attached to the top set using two screw and nut assemblies 21 at both ends. The lower set is attached using oversized holes and overlong screws so that this set is free to pivot on the attachments means and thus does not bear strenuously on the surface of the plate after the trailing edge has left the control of the transport rollers. This pivoting or floating action serves to ease the exit of the tail end of the plate when it leaves the guidance means and said plate tends to spring downwards. The plate enters the holding and orientation rollers 11A, 11B which serve two functions. The first being to re-orient the plate travel to a horizontal direction along the bottom of the tank 22 and the second being to hold and control the plate when the brushes 23A, 23B start acting on the plate, said brushes with their higher speed and pressure tending to pull the plate faster than desirable. Due to the relative stiffness and permanent downwards curl of some plates, after the leading edge passes the holding and orientation rollers the leading edge must be guided into the brush nips. The stationary deflector plate 24 mounted at an upward angle, insures that said leading edge arrives at the brushes in a location somewhere between the centerline of the bottom brush and the nip so that the brushes will suck the leading edge into their nip. When such plate is sucked into the nip it moves forward to take away the excess slack curvature of the plate which existed in the span between the prior holding roller nip and the brush nip and thus the plate rises above the deflector surface so that it then resumes its travel above the surface of the deflector and eliminating its potential for scratching or abrading the plate lower surface before it is scrubbed. The plate then enters the nip of the brushes which remove the now softened and unwanted coating areas of the plate. The plate is scrubbed on both sides by the pair of brush rollers rotating a significantly faster speeds (typical being 25 times roller speed) than transport rollers and unwanted coatings are thereby dislodged from the plate. The brush rollers are so positioned that the plate is now urged into an upwards orientation which will eventually lead the plate out of the solution. The plate after entering the brush nip then enters between a pair of closely spaced parallel plates referred to as the plate stiffening assembly 25A, 25B, and located as close into the nip as possible without their touching the brush bristles. The purpose of this assembly is to reduce the unsupported span of the plate to a minimum because the amount of plate bending is directly related to the unsupported span and the compressive force along the span and is analogous to bending phenomena in columns. The second benefit of this assembly is that it maintains the plate straight and unable to bend because the relatively strong force of the brushes at the tail end of the plate after it has left the control of the nip of the preceding holding rollers encounters a now very short cantilevered section which will not flip or bend upwards or downwards at its trailing edge as would happen without this device. The plate is then guided out of the solution and into the nips of the squeege rollers. Due to the configuration being such that the bottom squeege roller is partially immersed into the solution at all times, prior to the plate arriving at these rollers, the bottom roller had ample opportunity to re-wet any dried gum on the upper roller and thereby self-clean this pair of rollers. The plate as it enters the squeege nip is doctored of all excess solution on both faces with said excess returning to the main body of solution in the tank. The amount of residual gum coating on the plate can be controlled by adjustable pressure on the squeege roller bearing such that it dries on the plate surface in relatively short times. The squeegee rollers are mounted vertically above one another such that they now redirect the plate path into a horizontal mode. As the plate passes partially through the squeege nips its weight causes the plate to rest on the final segmented roller shaft 13 mounted on the same horizontal plane as the bottom squeege roller and urges the plate through the back opening of the casework, onto the receiving table 26 (see FIGS. 4 and 5). The plate emerges dry and ready for a printing press immediately or after a storage as the case may be. The tank containing the solution is designed to be only slightly larger than the mechanism which is inserted into it for the purpose of using a minimum charge of solution. Referring to FIG. 2 the tank is equipped with a drain hose 27 and valve 28 and may also be used with a branch in the drain hose 29 onto which is connected a filter 30 and a recirculating pump 31. The tank may also be fitted with an electrical means for heating the solution but such configurations will not be described because such means are well known to those versed in the art. The frame 32 serves as a mounting means for the electrical controls, to position the tank in place, and also by means of four open slots in each of the four corner-posts to position the mechanism into proper place. The mechanism is provided with four corner bosses 33 (see FIG. 3) which correspond to the slots mentioned above so that rapid insertion and positive location is always achieved. The back corner posts are fitted with two swiveling brackets 34 with end slots similar to those on the corner posts for the purpose of providing a support if it is desired to swing the mechanism out of the solution for inspection, maintenance, or cleaning. This is accomplished by grasping the rear tie rod of the mechanism 35 centrally and lifting the mechanism, pivoting on the front bosses and slots, and then raising the guides to engage the rear bosses. See FIGS. 3 and 4. Referring to FIG. 4, the mechanism itself is comprised of two side plates 20A and 20B, suitable tie rods 35 to insure rigidity and alignment, means to hold the shaft bearings 36, brackets to mount the guidance mechanism 37, the deflector 24, the plate stiffening assembly 25A, 25B, the ejector shaft 13, the bearing tensioners 38, and the belt tensioners 39, 40. Also part of the mechanism are the sets of preferably elastomeric covered rollers 10A, 10B, 11A, 11B, 12A, 12B, the set of brushes 23A, 23B, the means 14 to power the lower rollers and the associated transfer belts 41, 42, 43 and pullies 44 required. To positively drive the upper set of rollers and the top brush, the preferred embodiment employs sets of spur gears 45 mounted on each shaft with a pitch diameter slightly less than the roller diameter such that increasing tension or compressing rollers will not cause gears to bottom out and keep rollers apart. The bearing brackets which are permanently fastened to the sideplates are unique in respect to their simplicity, reliability, and serviceability. Both top 46 and bottom 47 bearings, although cylindrical at their base, have been fabricated and designed such that the end which works through the bearing slot is milled with parallel sides which permit up and down movement but no rotation. Since the base is of a greater cross-section than the milled end, the bearing cannot ride out of the bearing holder. Although the design is such that the roller shafts tend to keep the bearings to the bottom of the bearing slot this is not always the case, especially for the brush bearings where the tension and pull of the motor drive belt 48 may be sufficient to overcome the weight of the roller pair even with the application of spring pressure 54. In selected locations, the bottom bearing is held in place with a cross-bar of metal 50 fastened and removable from the bracket by two screws 51. The design of the bearing bracket gives this machine the uniqueness of being able to rapidly remove any and all rollers or brushes from the top of the machine without any disassembly of the tie rod assemblies and consequent jeopardy to the basic alignment of the mechanism itself. Referring to FIG. 1 casework 17 is designed to close off the mechanism from ambient foreign matter and because it is essentially sealed with the exception of the small access slit for plate entry and one for plate exit, there is a minimum of evaporative loss of the chemistry. The preferred embodiment does have a viewing window 28 on top which may also be removed for minor adjustment and a front table 16 which is mounted on a bracket 59 which allows such table to be taken out, reversed, and replaced thus serving as a baffle for the entry access of the machine further preserving the state of the solution. A further insurance against ambient attack of the solution is an internal horizontol shield 60 (see FIG. 2) which rests on both sideplates and covers the tank, with suitable openings for plate ingress and egress and motor belts, which further reduces the volume of air internal to the casework which could possibly affect the solution. The casework drops over the entire frame assembly and is positioned by four slots 64 and corresponding studs 62 in the frame. The back is provided with an access hole to store the flexible drain hose and valve when not in use and the front has an opening aligned directly in front of the electrical controls 51 which are mounted on the frame. Thus the casework can be removed easily with no electrical disconnection. The preferred embodiment also includes a means for receiving the processed plate without an attendant standing by the machine to catch and hold it. A lightweight table is fitted with two parallel wire assemblies 52 and brackets 53 such that when not in use said table rests neatly on top of the casework envelope and when needed is easily swung on its pivots to receive the processed plate.

What is claimed is:

1. An apparatus for continuously processing, in a horizontal through-put manner, both sides of a printing plate comprising:
    a tank for containing the processing solution, said tank having an entry end and a delivery end;
    a pair of substantially parallel entry rollers disposed adjacent the entry end of said tank, said rollers being disposed one above the other with the top roller leading the bottom roller to form a downwardly directed nip for receiving the plate and driving it towards the processing solution;
    a pair of substantially parallel guidance members which are downwardly oriented and disposed one above the other with the lower end of each member being submerged in the processing solution, the upward ends of said guidance members being outwardly flared, and disposed adjacent the nip of said entry rollers above the processing solution;

a pair of substantially parallel orientation rollers disposed adjacent the lower ends of said guidance members, said orientation rollers being disposed one above the other to form a nip for receiving said plate and transporting it in a horizontal direction, said orientation rollers being submerged in the processing solution;

a substantially flat deflector member disposed adjacent the nip of said orientation rollers, said deflector member being upwardly oriented within the processing solution so as to direct said plate upwardly;

a pair of brush rollers disposed adjacent the deflector member, and one above the other with the top brush roller trailing the bottom brush roller to form an upwardly directed nip for receiving the plate, directing it in an upward direction and scrubbing both sides of said plate, said nip being disposed within the solution such that the plate is fully submerged in the solution as it is being scrubbed, said brush rollers being adapted to rotate at a higher speed than said orientation rollers and entry rollers;

a pair of substantially flat, parallel plate stiffening members disposed closely adjacent said brush rollers, one above the other in a closely spaced relationship for preventing the brushes from accelerating the travel of the plate, said plate stiffening members being upwardly oriented such that the upper ends thereof are disposed above the processing solution;

a pair of squeege rollers disposed adjacent the trailing end of said plate stiffening members, one above the other to form a nip for receiving the plate, removing excess solution from the plate, and transporting the plate in a horizontal direction towards the delivery end of the tank;

means for rotating said entry rollers, orientation rollers, and squeege rollers at substantially the same speed;

and means for rotating said brush rollers at a speed greater than that of said entry rollers, orientation rollers, and squeege rollers.

2. An apparatus for processing both sides of an offset printing as recited in claim 1 in which said lower guidance member is pivotally connected to said upper guidance member for reducing pressure on the plate as it leaves said entry rollers, and for easing the exit of the tail end of the plate as it leaves said guidance means.

3. An apparatus for processing both sides of an offset printing as recited in claim 1 wherein said bottom squeege roller is partially submerged in the processing solution.

4. An apparatus for processing both sides of an offset printing as recited in claim 1 further including means for adjusting the pressure exerted by said squeege rollers on the plate.

5. An apparatus for processing both sides of an offset printing as recited in claim 1 in which said brush rollers are adapted to rotate at a speed approximately 25 times greater than that of said entry rollers, orientation rollers and squeege rollers.

6. Apparatus as recited in claim 1 where the active solution is a combination of developer and a compatable preservative coating which will render the finished plate impervious to dirt or oxidation before usage.

* * * * *